United States Patent [19]
Buchmann et al.

[11] Patent Number: 5,319,725
[45] Date of Patent: Jun. 7, 1994

[54] BILITHIC COMPOSITE FOR OPTOELECTRONIC INTEGRATION

[75] Inventors: Peter Buchmann, Langnau am Albis; David J. Webb, Rueschlikon; Peter Vettiger, Langnau am Albis, all of Switzerland

[73] Assignee: International Business Machines Corporation, Armonk, N.Y.

[21] Appl. No.: 995,490

[22] Filed: Dec. 23, 1992

[30] Foreign Application Priority Data

Dec. 23, 1991 [EP] European Pat. Off. ......... 91810995.0

[51] Int. Cl.[5] ............................................. G02B 6/12
[52] U.S. Cl. ................................... 385/14; 385/15
[58] Field of Search .................. 385/14, 15, 27, 38, 385/52

[56] References Cited

U.S. PATENT DOCUMENTS

| | | | |
|---|---|---|---|
| 5,009,476 | 4/1991 | Reid et al. | 385/14 |
| 5,061,027 | 10/1991 | Richard | 385/14 |
| 5,103,494 | 4/1992 | Mozer | 385/14 |
| 5,182,780 | 1/1993 | Robertson | 385/38 |

Primary Examiner—Rodney B. Bovernick
Assistant Examiner—Stephen W. Barns

[57] ABSTRACT

Optoelectronic composite consisting of two chips, the first chip 10 being made of a first material, the second one 13 being made of another material. The first chip 10, for example, comprises a multiplicity of active optoelectronic devices e.g. a laser diode 11 and a photo diode 12, all being monolithically integrated. A multiplicity of other optical devices, e.g. a waveguide 16, is monolithically integrated on the second chip 13. In addition this second chip 13 has depressions of the size of the devices 11,12 integrated on said first chip 10. These devices and the waveguide 16 of the second chip 13 are automatically aligned when flipping both chips together.

14 Claims, 8 Drawing Sheets

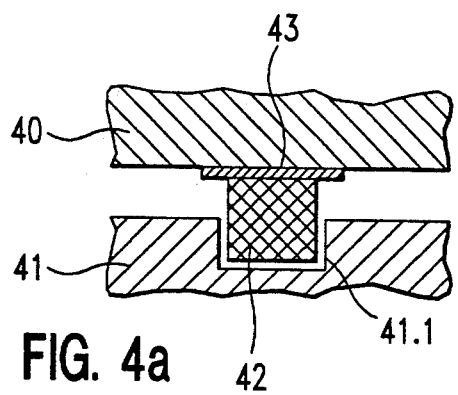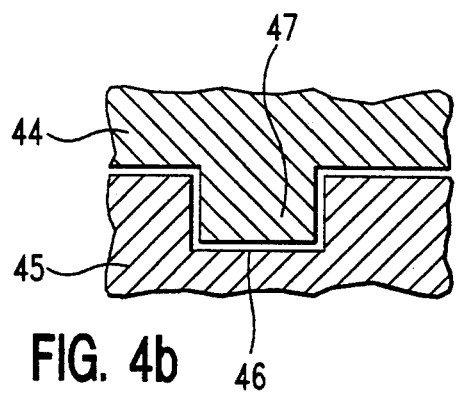
FIG. 4a    FIG. 4b
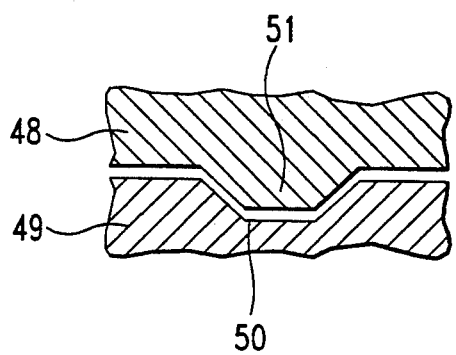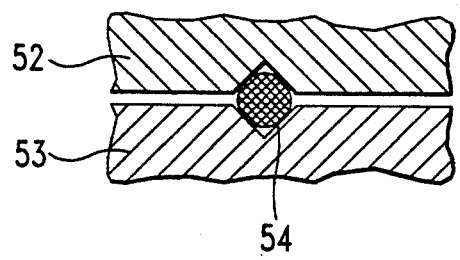
FIG. 4c    FIG. 4d
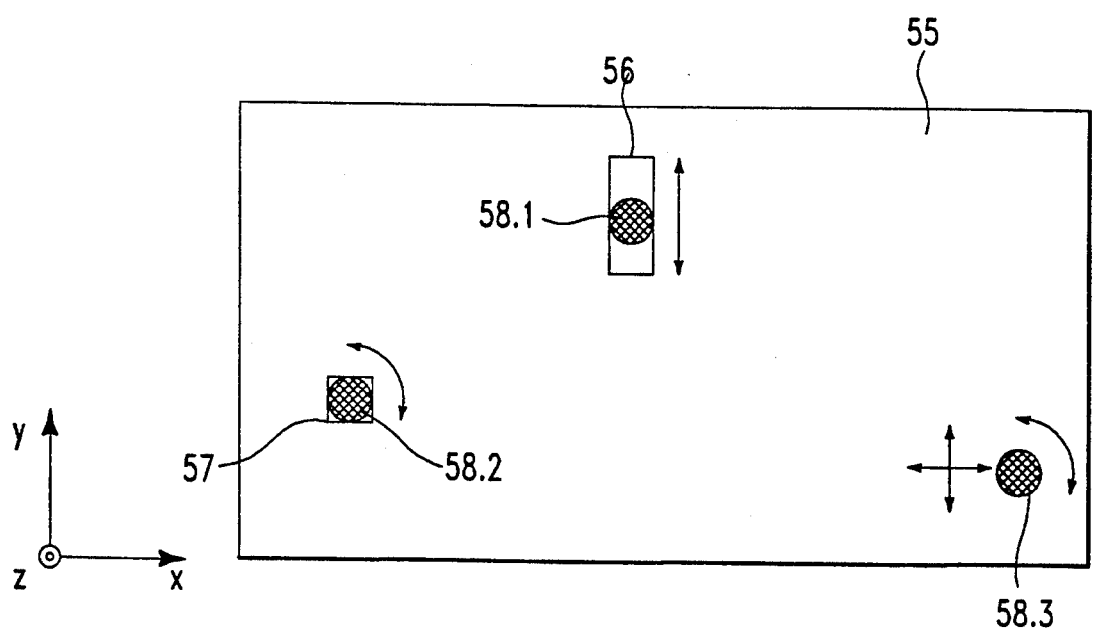
FIG. 5

BILITHIC COMPOSITE FOR OPTOELECTRONIC INTEGRATION

TECHNICAL FIELD

Disclosed are structures for passive alignment of optoelectronic components made in one materials system with other components made in one or more dissimilar materials systems.

BACKGROUND OF THE INVENTION

Similar to the increasing packaging density in the field of conventional semiconductor devices, which started from single elementary devices, as e.g. diodes and transistors, and has now reached a point where thousands of very small components are three-dimensionally integrated on one chip, the integration of optoelectronic components becomes more and more important. The trend in optoelectronics is towards integration of active optoelectronic devices, passive optical waveguide devices, and functional optical waveguide devices to form complete optoelectronic units such as for example optical heads for optical disks, optical multi-/demultiplexers, and circuits for optical computers. Through the optoelectronic integration, a more compact, stable, and functional optical system can be achieved.

OptoElectronic Integrated Circuits (OEICs), also known as Optical Integrated Circuits (OICs), are divided into two main types from the standpoint of materials. When all components of the circuit are integrated on a single substrate, such as Si, GaAs or InP, the type of integration is called monolithic optoelectronic integrated circuit. A typical monolithic optoelectronic integrated circuit with GaAs laser diode 7 and photodiode 8, integrated on a GaAs substrate 5 with planar waveguide 6, is shown in FIG. 1 a). Typical monolithically integrated lasers and other components are described in the article "Integrated Optics Approach for Advanced Semiconductor Lasers", of Y. Suematsu et al., Proceedings of the IEEE, Vol. 75, No. 11, November 1987, pp. 1472-1487. Other examples for the monolithic integration of GaAs components on a Si substrate are given in the U.S. Pat. Nos. 4,890,895, and 4,774,205.

When the components are made of different materials and then bonded together, this is called a hybrid optoelectronic integrated circuit. For example, in a hybrid optical IC, as illustrated in FIG. 1 b), laser diode 3 is made of aluminum gallium arsenide (AlGaAs), the detector-diode 4 of silicon (Si), and the planar waveguide 2, grown on substrate 1, of lithium niobate (LiNbO$_3$).

Although the monolithic-type OEIC is ideal as an OEIC, implementation is very difficult at present. While the performance of monolithically integrated GaAs components on Si substrates, see U.S. Pat. No. 4,890,895, is good, these components have not yet reached the quality of those fabricated using GaAs substrates. Since typical OEICs consist of a number of different optical components no one substrate material will be optimum for all of them. Thus, a compromise must be made.

The hybrid type, on the other hand, is relatively easy to fabricate, but there is a problem with assembling the basic components. Packaging and alignment of these components is time consuming and expensive. Nevertheless, the hybrid optoelectronic ICs have the great advantage in that what are currently the most appropriate materials and processing techniques for each device can be utilized. Because of these advantages, hybrid integrated optoelectronic circuits will be subject of intensive research and development.

Different hybrid optoelectronic packages are known in the art, where one or more optical fiber(s) is/are connected to an optoelectronic component or waveguide. A silicon chip coupling concept is reported on in the article "Permanent Attachment of Single-Mode Fiber Arrays to Waveguides", of E. J. Murphy et al., IEEE Journal of Lightwave Technology, Vol. LT-3, No. 4, August 1985, pp. 795-798. The coupling concept, described by E. J. Murphy, is based on a silicon chip having V-grooves for mounting a bundle of parallel single-mode fibers. The polished end facets of these fibers are butt-coupled to a substrate with waveguides, using optical cement. H. Kaufmann et al. describe in their article "Self-Adjusted Permanent Attachment of Fibers to GaAs Waveguide Components", published June 1986 in Electronics Letters, Vol. 22, No. 12, pp. 642-644, an alignment scheme for aligning optical fibers to a GaAs chip. This alignment scheme, called V-groove flip-chip mounting technique, is characterized in that two fibers and the GaAs chip are mounted on a substrate with V-groove, the alignment being achieved by moving the fibers towards the chip along this V-groove.

Another principle for the alignment of waveguides and/or fibers to optoelectronic components is reported on in the U.S. Pat. No. 4,892,374. As therein described, an optoelectronic component, e.g. a light emitting diode (LED), is bonded in a recessed part of a substrate such that its light emitting facet is coupled to a waveguide being integrated on this substrate. In the article "Multi-Waveguide/Laser Coupling", of E. B. Flint et al., IBM Technical Disclosure Bulletin, Vol. 31, No. 10, March 1989, pp. 384-386, a hybrid package is disclosed comprising fibers carried by a silicon alignment fixture. For lateral and axial alignments, grooves are formed in the top surface of the laser array which has to be coupled to the array of fibers, and in the alignment fixture. This package allows self-alignment of an array of lasers to an array of fibers. Another passive alignment scheme is described in the publication "Passive Coupling of InGaAsP/InP Laser Array and Singlemode Fibers using Silicon Waferboard", of C. A. Armiento et al., Electronics Letters, Vol. 27, No. 12, June 1991, pp. 1109-1111. A laser array is aligned to an array of fibers by providing for an integration platform with alignment pedestals and standoffs on a substrate with V-grooves in which the fibers are situated.

Some disadvantages of the different hybrid alignment schemes cited above are their cost and time intensive manufacturing and the non-efficient coupling. Another disadvantage is the difficult handling of the small components like lasers and other diodes which have to be precisely bonded to the substrate. The alignment problems are not known in the area of monolithically integrated circuits because the active-, passive-, and functional waveguide-devices are automatically aligned by using special photolithographic masks, with the drawback on the other hand, that all different components have to be made out of the same material.

These known approaches do not allow for an efficient integration of multiple components, waveguides and fibers. No prior art is known, relating to simultaneous and self-adjusting alignment schemes for hybrid integration of multiple active optoelectronic devices, functional optical waveguide devices, and passive optical waveguide devices.

SUMMARY OF THE INVENTION

The object of this invention is to provide a method for hybrid integration of optoelectronic components such as active optoelectronic devices, passive optical waveguide devices, and functional optical waveguide devices.

Another object of this invention is to provide a structure for hybrid integration of optoelectronic components such as active optoelectronic devices, passive optical waveguide devices, and functional optical waveguide devices.

A further object of the present invention is to improve the performance and reliability of optoelectronic integrated circuits OEICs, by making the respective components using materials systems which are well suited.

Another object of the present invention is to provide an alignment scheme which allows for automatic alignment of multiple components at the same time thus leading to complex and very reliable highly integrated circuits.

Another object is to improve the overall yield of a complex opto-electronic system by making the different types of devices on separate substrates and bonding together only those good ones from each type.

The invention as described and claimed is intended to meet these objectives and to remedy the remaining deficiencies of known monolithic and hybrid optoelectronic integrated circuits. The principle by which this is accomplished is to provide for a bilithic composite having a first substrate with components made of a first material, and a second substrate with components made of another material, the components being located on these substrates such that they are automatically aligned when flipping both substrates together.

DESCRIPTION OF THE DRAWINGS

The invention is described in detail below with reference to the following drawings which are schematic and not drawn to scale, while more particularly the thickness of cross-sectional shown parts and semiconductor layers are exaggerated for the sake of clarity.

FIGS. 4a–4d show schematic sketches of alignment means in accordance with the present invention.

FIG. 5 is a schematic view of alignment means in accordance with the present invention.

GENERAL DESCRIPTION

Figures 1A, 1B:
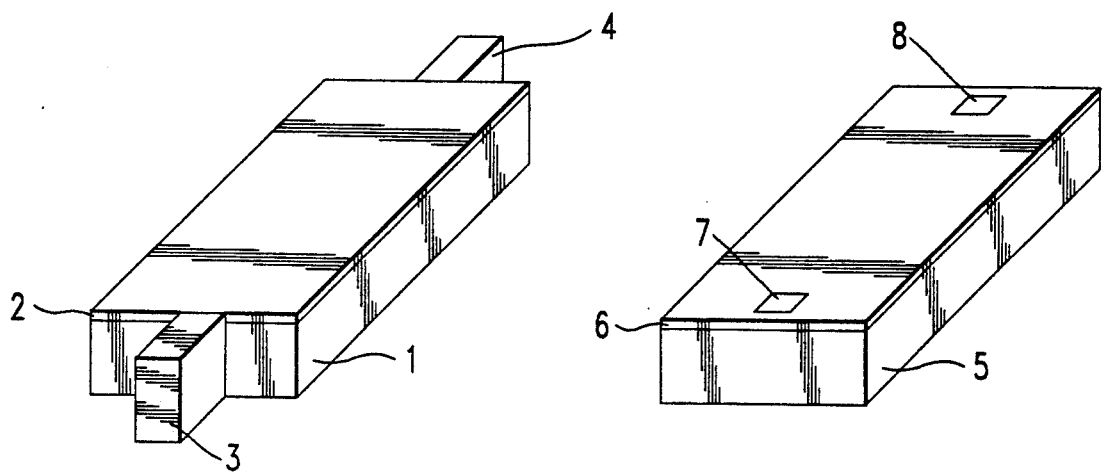
FIG. 1a is a monolithic GaAs optoelectronic integrated circuit (OEIC) with laser- and photo- diodes integrated on the same substrate. (Prior Art)
FIG. 1b is a hybrid optoelectronic integrated circuit (OEIC) with AlGaAs laser diode and Si photodiode butt-coupled to a LiNbO$_3$ substrate with waveguide. (Prior Art)
Figure 2:
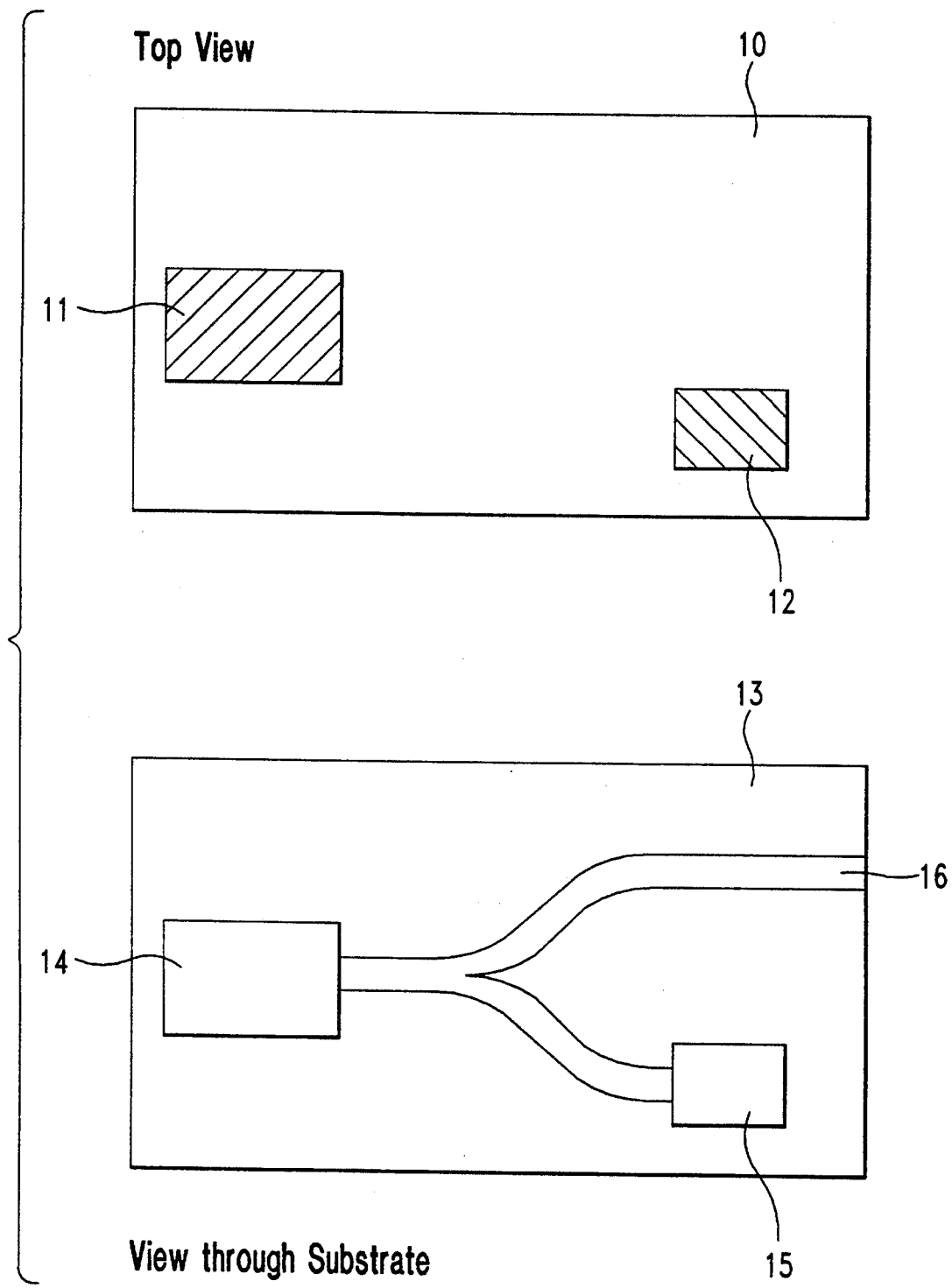
FIG. 2 is a bilithic composite, in accordance with the present invention, consisting of two different chips, the upper one with integrated laser diode and photodiode, the lower one with an integrated waveguide and two depressions which have the size of the laser and photodiode of the upper chip.

The next sections relate to different electronic and optoelectronic components, some of them requiring special materials, which can be integrated in the inventive bilithic composites. The invention allows for an integration of conventional electronic components, such as transistors, diodes, capacitors, resistances etc., as well as active optoelectronic, passive optical waveguide, and functional optical waveguide devices. The conventional components are not described in detail because their design and fabrication is known in the art. These components can typically be fabricated on Si, GaAs as well as other III-V semiconductors, and II-VI semiconductors.

The optoelectronic components are to be divided into three main groups; passive optical waveguide devices, active optoelectronic devices, and functional optical waveguide devices. Some of these components are listed in Tables 1–3.

Typical passive optical waveguide devices, which exhibit static characteristics for optical waves, i.e. those without an optical wave control function by external signal, are optical path bending components, optical beam dividers, polarizers, wavelength demultiplexers, lenses, mirrors, and so forth. Passive materials, incapable of light generation, like quartz ($SiO_2$), lithium niobate ($LiNbO_3$), potassium niobate ($KNbO_3$), lithium tantalate ($LiTaO_3$), barium titanate ($BaTiO_3$), arsenic sulphide ($As_2S_3$), arsenic selenide ($As_2Se_3$), tantalum pentoxide ($Ta_2O_5$), niobium pentoxide ($Nb_2O_5$), titanium niobate ($TiNbO_3$), silicon (Si), zinc sulphide (ZnS), calcite ($CaCO_3$), epoxy, polymide, and glass are used for the fabrication of these passive optical waveguide devices. The class of passive optical waveguide devices is subdivided into bulk components and waveguide components. Examples for bulk components are mirrors, lenses, and prisms. Novel functions, not feasible with these bulk components, may be obtained by the use of waveguide components. The different materials on which these components can be realized are given in Table 1.

TABLE 1

| Passive Optical Waveguide Devices | |
|---|---|
| Component | Material/Class of Materials |
| Prism | $SiO_2$, $LiNbO_3$, glass, ZnS, Epoxy |
| Geodesic Component | ZnS, Epoxy |
| Facet mirror | Si, glass, $TiNbO_3$, ZnS, Epoxy |
| Ridge | Si |
| Reflection type grating | $As_2S_3$, $LiNbO_3$ |
| Bent waveguide | $SiO_2$, $LiNbO_3$, glass, ZnS, Epoxy |
| Power divider | $SiO_2$, $LiNbO_3$, glass, ZnS, Epoxy |
| Polarizer | $LiNbO_3$, $CaCO_3$, $Nb_2O_5$ |
| Wavelength Multiplexer/ Demultiplexer | $As_2S_3$, $Ta_2O_5$ |
| Waveguide lens | $LiNbO_3$, $As_2S_3$, $Ta_2O_5$, ZnS, $Nb_2O_5$ |
| Focusing grating coupler | glass, $LiNbO_3$ |

These passive optical devices are described in greater detail in the book "Optical Integrated Circuits", of H. Nishihara et al., McGraw-Hill Optical And Electrooptical Engineering Series, McGraw-Hill Book Company, 1987, Chapter 9.

Typical functional optical waveguide devices are listed in Table 2. To date, a variety of these devices have been proposed and fabricated. In all of them the light is essentially controlled via physical phenomena. These phenomena are based on ElectroOptic (EO), AcoustoOptic (AO), MagnetoOptic (MO), Nonlinear-Optic (NO), and ThermoOptic (TO) effects. Electrooptic waveguide devices which employ the electrooptic effect are well known in the art, most of them being realized using $LiNbO_3$ substrates with Ti diffused waveguides. Some examples are given in Table 2.

Acoustooptic devices, based on the acoustooptic effect, provide an important means of optical wave control and implements various functional devices. The AO devices are classified by their coupling configuration in collinear and coplanar devices. They can be further classified by their material combination. Exemplary combinations are:

piezoelectric waveguide and substrate with $Ti:LiNbO_3$ transducer;

non-piezoelectric film waveguide (e.g. $As_2S_3$) on piezoelectric substrate (e.g. $LiNbO_3$ with $LiNbO_3$ transducer;

piezoelectric film waveguide (e.g. ZnO) on non-piezoelectric substrate (e.g. $SiO_2$) with ZnO transducer;

non-piezoelectric substrate (e.g. $SiO_2/Si$) and non-piezoelectric waveguide (e.g. $As_2S_3$) with thin piezoelectric ZnO transducer.

Some exemplary AO devices are listed in Table 2. Typical Thin-Film AO devices are reported on in the article "Thin-Film Acoustooptic Devices", of E. G. H. Lean et al., Proceedings of the IEEE, Vol. 64, No. 5, May 1976, pp. 779-787. The properties of materials used for Acoustooptic AO and Electrooptic EO devices are listed in Table 1 on page 785 of the above cited article written by E. G. H. Lean.

Waveguide magnetooptic devices are implemented by using a waveguide of YIG ($Y_3Fe_5O_{12}$), which is a magnetic material that is transparent in the near infrared region. The large Faraday effect, induced in this material with a magnetic field that is produced by a small current, allows relatively fast optical modulation and switching with low driving power, thus being very important for future hybrid OEICs. Examples of waveguide MO devices are given in Table 2.

The effect of non-linearity is used in nonlinear optical devices. These devices are also called optical bistable devices. Examples are given in Table 2.

Functional optical waveguide devices employing the thermooptic effect, are based on the fact that the refractive index varies with the temperature. A stable thermooptic effect is obtained only in the materials without deformation or any change in quality caused by a temperature increase. In other words, a requirement for the TO waveguide device is that the temperature for the waveguide formation is much higher than the operating temperature of the device. There are many waveguide materials that meet this requirement. Glass waveguides in particular are the most interesting of the TO devices. This is why the thermooptic effect can provide the functions of light modulation and switching in glass waveguides, which have been used to date for passive optical waveguide devices only. Examples of TO waveguide devices are given in Table 2.

TABLE 2

Functional Optical Waveguide Devices

| Component | Material/Class of Material | Basic Phenomenon |
|---|---|---|
| Phase modulator | $LiNbO_3$ | EO |
| Polarization modulator | $LiNbO_3$, GaAs, InP | EO |
| Interferometric waveguide modulator | $LiNbO_3$ | EO |
| Optical wavelength filter | $LiNbO_3$ | EO |
| Optical switch | $LiNbO_3$, $LiTaO_3$, InP | EO |
| Bragg grating | $LiNbO_3$ | EO |
| Mode converter | $LiNbO_3$, glass, ZnO | AO |
| Tunable wavelength filter | $LiNbO_3$, ZnO | AO |
| Bragg modulator | $Ta_2O_5$, $As_2S_3$, $LiNbO_3$ | AO |
| Bragg deflector | $LiNbO_3$ | AO |
| Mode-conversion type switch | YIG ($Y_3Fe_5I_{12}$), GGG ($Gd_3Ga_5O_{12}$) | MO |
| Mode conversion type modulator | YIG, GGG | MO |
| Optical isolator | YIG, GGG, $LiNbO_3$ | MO |
| Fabry-Perot resonator | KTP | NO |
| 2nd harmonic generation | $LiNbO_3$, Polymers, $Knbo_3$ | NO |
| Bistable optical switch | ZnS, ZnSe | NO |
| Cut-off switch | glass | TO |
| Branching waveguide switch | glass | TO |

Typical functional optical waveguide devices are described in the already cited book of H. Nishihara. The nonlinear Fabry-Perot Resonator is reported on in the special issue of Journal of Quantum Electronics on Optical Bistability, edited by E. Garmire, October 1985. In another article, titled "Optical Bistability without Optical Feedback and Absorption-Related Nonlinearities", the same author describes means for obtaining optical bistability employing ZnSe waveguides. This article is published in the book "Laser Optics of Condensed Matter", edited by J. L. Birman et al., Plenum Press, New York and London, pp. 481-490. Another article relating to nonlinear optics (NO), in particular $LiNbO_3$ thin-film optical waveguides applications to 2 nd harmonic generation, has been published in Journal of Applied Physics, Vol. 70, No. 5, September 1991, pp. 2536-2541 by H. Tamada et al. The title of this article is; "$LiNbO_3$ Thin-Film Optical Waveguide Grown by Liquid Phase Epitaxy and its Application to Second-Harmonic Generation".

Some examples for active electrooptical devices are; laser diodes, photodiodes, light emitting diodes (LEDs), solar cells and so forth. The great flexibility of the present invention can be seen by integrating the new developed microlasers, which emit light perpendicular to the surface of the wafer, instead of conventional diode lasers. These microlasers are reported on in the article "Microlasers", J. L. Jewell et al., Scientific American, November 1991, pp. 56-62.

The active electrooptical devices are fabricated on active materials which are capable of light generation, such as gallium arsenide (GaAs), gallium aluminum arsenide (GaAlAs), gallium arsenide phosphide (GaAsP), gallium indium arsenide (GaInAs) and other III-V and II-VI direct bandgap semiconductors. The disadvantage of these materials is that they are not optimum for the integration of the passive optical and functional optical waveguide devices. Typical active electrooptical devices are listed in following Table 3.

TABLE 3

| Component | Active Electrooptical Devices Material/Class of Materials |
|---|---|
| Laser diode | GaAs, InP, III-V, II-VI semiconductors |
| Microlaser diode | GaAs |
| Light emitting diode | GaAs, InP, III-V, II-VI semiconductors |
| PIN photodetector | GaAlAs, III-V semiconductors |

Figure 3:
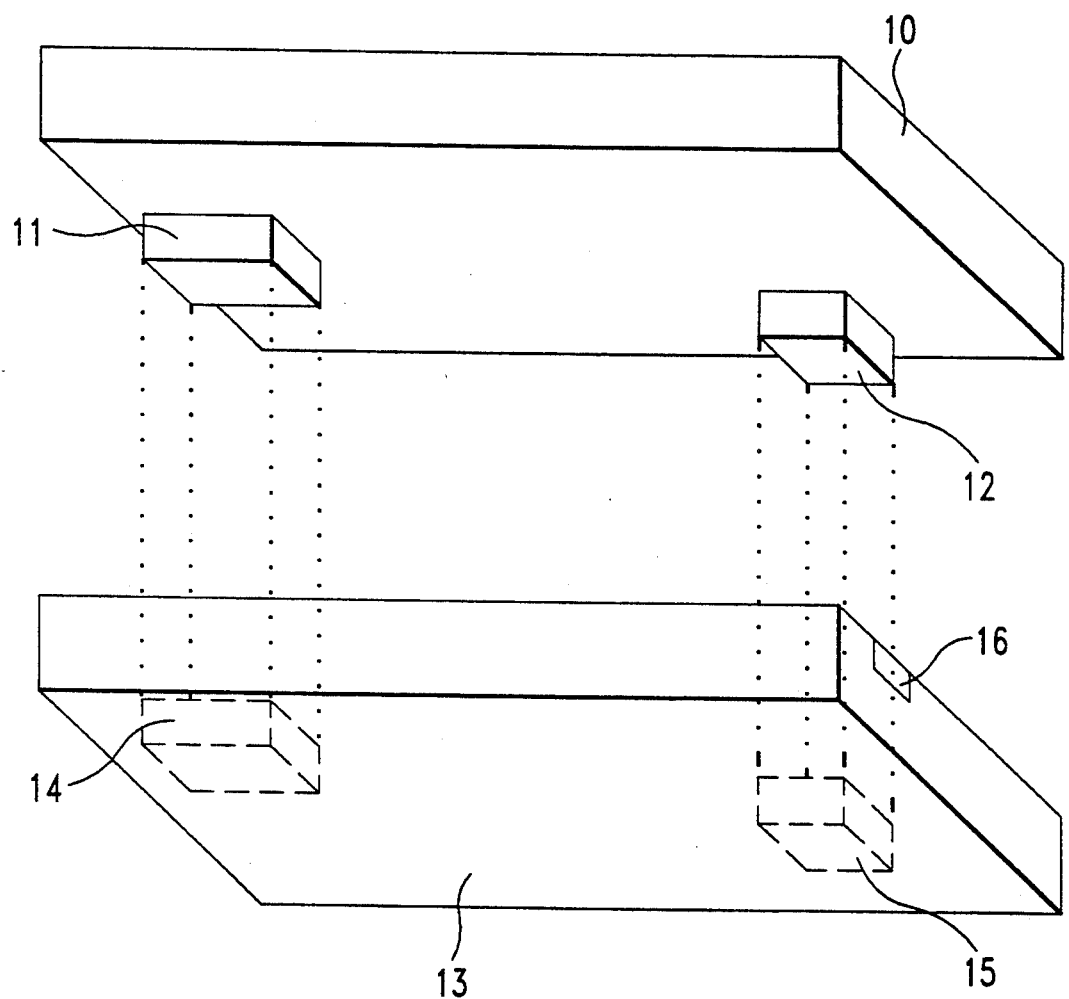
FIG. 3 is an exploded view of the composite shown in FIG. 2.

Embodiments of the present invention comprising some of the above listed active electrooptical, passive optical waveguide, and functional optical waveguide devices are described in connection with FIGS. 2-12. The principle of the present invention is described in context with the first embodiment, illustrated in FIGS. 2 and 3. This embodiment consists of two chips 10 and 13, the upper one being made of a first material, e.g. an active material like GaAs, and the second one being made of a second material, e.g. a passive material like LiNbO$_3$. Two active electrooptical devices, a laser diode 11 and a photodiode 12 are fabricated on this first chip 10. The second chip 13 comprises a passive optical device, a Y-shaped waveguide 16 being made by Ti diffusion in LiNbO$_3$ substrate, and two depressions 14, 15 which have the size of the components 11 and 12 on the first chip 10. The positions of the depressions 14 and 15 on chip 13 and the alignment of the depressions 14 and 15 with respect to the waveguide 16 are defined by the lithographic masks used during the fabrication of this chip. As shown in FIG. 3, both chips 10 and 13 form a composite when urged together such that all components of the respective chips are automatically aligned. In the first embodiment the two active devices 11 and 12, and the depressions 14 and 15 on the facing side serve as mechanical alignment means bringing both chips into an optimum position. The composite, consisting of two chips joined together, may be mounted on a mounting base in a metal housing and a conventional piston or spring may provide for thermal heat transfer between the heat sources on the chips and a heat sink.

Features of the present invention are:

The accurate permanent passive alignment of the components of one chip relative to the other components;

The simultaneous alignment of many optical and, as shown in another embodiment, electronic components with one alignment step;

The ability to fabricate transparent waveguides, functional optical waveguide devices and passive optical devices on the 'passive' chip which have low losses and optimum quality for the respective components (not achievable by monolithic integration);

Since the 'active' and 'passive' chips can be fabricated separately the yields of the bilithic composite are not the product of the yields of each chip. Good samples of each 'active' and 'passive' chip can be selected by testing them prior to joining them together;

Substrates can be chosen which optimize fabrication of the active electrooptical devices, passive optical waveguide devices, and functional optical waveguide devices separately, e.g. a LiNbO$_3$ chip could be combined with a GaAs chip for matching of nonlinear optical (NO) devices with lasers;

The active electrooptic devices, passive optical waveguide devices, and functional optical waveguide devices can be made in any number, and any orientation using etched mirror technology on their respective substrates;

Conventional electronic components as transistors, diodes, capacitors, resistances, driver circuits and so forth can be integrated on one of the chips forming a complete functional unit;

Complete and complex circuits can be made using only two different substrates and one alignment step during packaging;

Vertical alignment as well as horizontal alignment is defined by microlithographic techniques and is thus very accurate;

Each chip can carry means for electrical and/or optical interconnections, such that for example wires can be coupled, e.g. by aligning them in V-shaped grooves, to the waveguides on the respective chip.

The chips are limited in size only by differential thermal expansion of the composite. The layout of the chips and the design of the alignment means have to be made such that thermal heating, caused by heat sources on the chips, does not lead to stress or strain capable of destroying the composite or even reducing the coupling efficiency between the components. The maximum allowable temperature raise can be estimated using the following equation:

$$\Delta T = \frac{\Delta l}{l|T_{CE1} - T_{CE2}|}$$

wherein $T_{CE}$ are the temperature coefficients of the substrates 1 and 2, l is the length of the overlap between the chips, and $\Delta l$ is the maximum alignment tolerance. For instance in a composite of a Si chip ($T_{CE1}=2.6\times10^{-6}$) and a GaAs chip ($T_{CE1}=6.86\times10^{-6}$), both chips being square chips with a length of $l=0.01$ m, and with a maximum alignment tolerance of 0.1 $\mu$m (which is quite aggressive), the allowable $\Delta T$ is about 2° C. This $\Delta T$ is quite simple to achieve with conventional Peltier coolers for example. A list of temperature coefficients is given in Table 4. More details about these materials can be taken from standard reference works.

TABLE 4

| Temperature Coefficients of Thermal Expansion | |
|---|---|
| Material | $T_{CE}$ [°C.$^{-1}$] |
| GaAs | $6.86 \times 10^{-6}$ |
| Si | $2.6 \times 10^{-6}$ |
| SiO$_2$ | $0.5 \times 10^{-6}$ |
| InP | $4.75 \times 10^{-6}$ |
| LiNbO$_3$ | $4 \times 10^{-6}$ |
| CaCo$_3$ | $21 \times 10^{-6}$ |
| ZnO | $6 \times 10^{-6}$ |
| GaP | $4.65 \times 10^{-6}$ |
| BaTiO$_3$ | $1.9 \times 10^{-5}$ |
| As$_2$S$_3$ | $2.4 \times 10^{-5}$ |
| ZnS | $6.9 \times 10^{-6}$ |
| glass | see literature ($\sim 3 \times 10^{-6}$) |

With the employment of different alignment means it is possible to achieve vertical and horizontal alignment as well as mechanical alignment of the chips comprising the inventive composites. Some exemplary alignment means are illustrated in FIG. 4. An electro-plated pillar 42 of any convenient material such as grown on top of a plating base 43 by conventional techniques, and a depression 41.1 on the opposite side, see FIG. 4 a), can be employed to align upper chip 40 relative to lower chip 41. Electro-plated pillars and similar means are well suited because of the high aspect ratio (aspect ratio: height/width) that can be achieved. Chip 44, shown in FIG. 4 b), has a ridge 47 made of the same material as the substrate. A depression 46 in the opposite chip 45 is designed such that the ridge 47 fits into this depression when fitting chips 44 and 45 together. The side walls of this ridge are dry-etched such that they are perpendicular to the chip's surfaces. Similar alignment means for the alignment of chips 48 and 49, are illustrated in FIG. 4 c), with the only difference that the side walls of ridge 51 and depression 50 are wet-etched, giving a slanting side wall. The example shown in part d) of FIG. 4 serves as fiber holder and in addition aligns the upper chip 52 and lower chip 53 at the same time. To achieve this, fiber 54 is situated in V-shaped grooves of the chips 52 and 53.

The cross-sections of possible alignment means are illustrated in FIG. 4, not showing where to place these means on a chip. An example is illustrated in FIG. 5. Shown is the top view of a chip 55 which has two depressions 56 and 57. The depression 56 has a rectangular shape and the depression 57 a rectangular shape. The upper chip which has to be flipped onto the lower chip 55 is not shown in this Figure. Only alignment means 58.1–58.3, with circular cross-sections are schematically illustrated. These alignment means 58.1–58.3, e.g. metal balls or cylindrical pillars, fit into the depressions 56 and 57 of chip 55. Alignment means 58.2 defines the position of the upper chip relative to the lower one, but does allow rotational movements around an axis parallel to the z-axis. Alignment means 58.1 allows linear movements parallel to the y-axis, for example linear movements caused by temperature differences in the composite, but prevents rotational movements around an axis parallel to the z-axis. Pillar or ball 58.3, which is not guided by a depression on chip 55, is the third standpoint allowing rotational as well as linear movements in the x-y plane. Different combinations of these and other alignment means are conceivable. In addition to these alignment means, the components on one chip can be placed in depressions of the opposite chip, to align both chips of a composite, as illustrated in FIG. 3.

Figure 6:
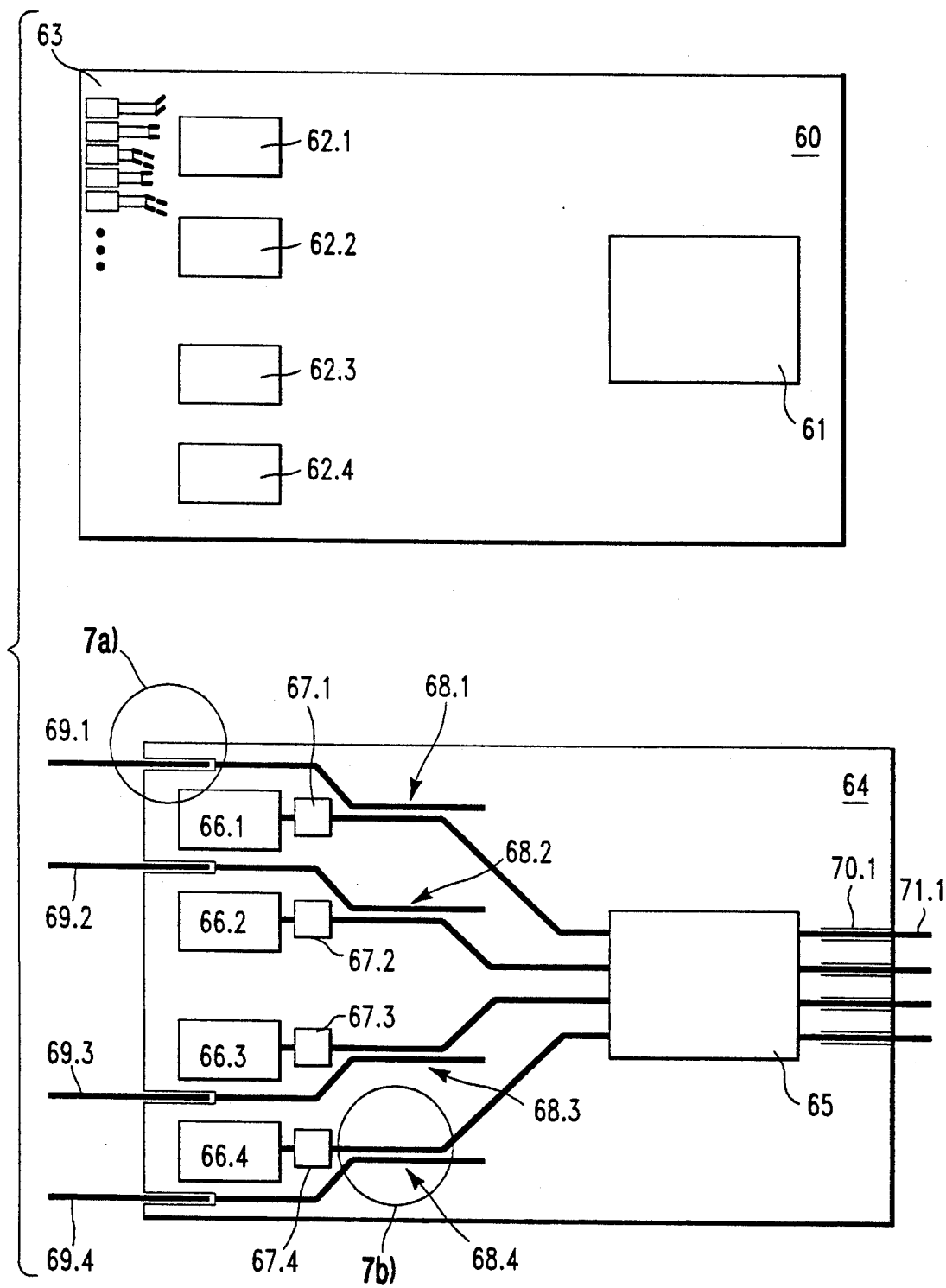
FIG. 6 shows both chips of a composite, in accordance with the present invention.
Figure 7A:
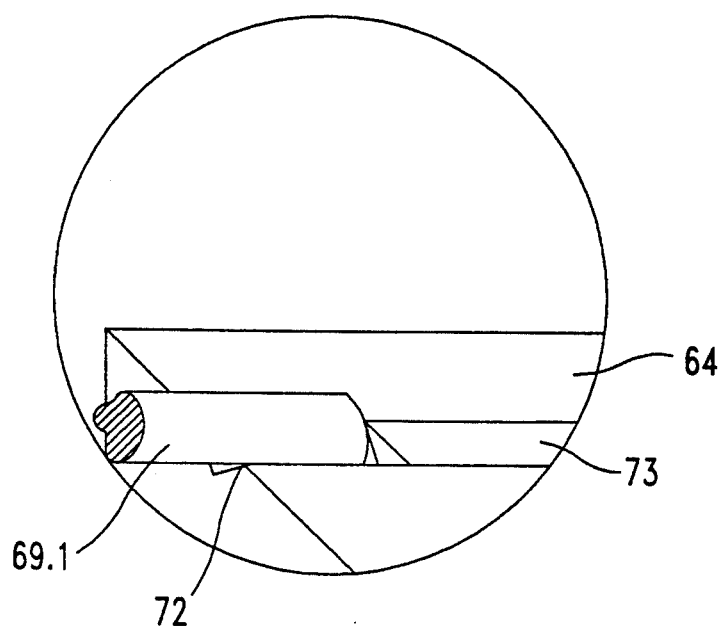
FIGS. 7a and 7b show details of FIG. 6.
Figure 7B:
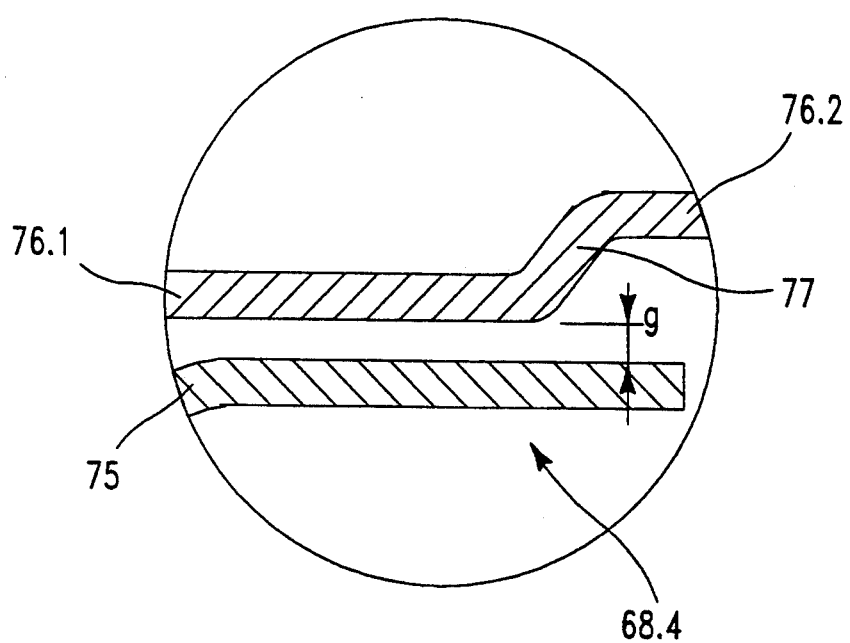

The second embodiment of the present invention is described below with reference to FIG. 6, showing the upper chip 60 and the lower chip 64. FIG. 7 shows two magnified perspective sketches of portions of chip 64 indicated by circles labelled 7a and 7b. The upper chip 60 consists of InP and comprises four InP/InGaAsP laser diodes 62.1–62.4 with etched mirrors and a bidirectional 4×4 optical InP switch 61. This optical 4×4 switch is an electrooptical functional waveguide device which achieves switching action through carrier injection thus causing a change in the refractive index. More details of this respective switch, which may be replaced by other types of switches, is reported on in the publication "NCM, Network Configuration Module, Optical Switch", issued by Siemens AG, Gesch&ae.ftsgebiet &Oe.ffentliche Vermittlungssysteme, Postfach 70 00 73, 8000 Munich 70, Germany, Order No.: A30930-N1250-P24-1-7629. Bonding pads 63 are situated on the left hand side of chip 60. These pads are connected with the active devices 61 and 62.1–62.4 and provide for electrical interconnection ports to other circuits, power supply etc. The bonding pads 63 and the respective conducting paths are only schematically shown.

The lower chip 64 is designed such that the upper chip 60 overlaps the left portion of it when flipping them together. Chip 64 consists of LiNbO$_3$. On the opposite side of the laser diodes 62.1–62.4 and the optical switch 61, are depressions 66.1–66.4, and 65 situated, having the size of these active devices. Chip 64 further comprises waveguides, waveguide directional couplers 68.1–68.4, V-shaped grooves 70.1, and optical isolators 67.1–67.4. The V-shaped grooves serve as alignment means for external optical fibers which have to be coupled to the composite. A V-shaped groove 72 with optical fiber 69.1 is schematically shown in FIG. 7 a) in form of a magnified perspective sketch. As can be seen from this Figure, a V-shaped groove 72 is etched into the LiNbO$_3$ substrate 64 such that the end facet of this groove is aligned to the Ti diffused LiNbO$_3$ waveguide 73. Details of materials and fabrication techniques of optical waveguides, in particular Ti:LiNbO$_3$ waveguides, are given in chapter 6 of the book "Optical Integrated Circuits", of H. Nishihara et al., McGraw-Hill Optical And Electrooptical Engineering Series, McGraw-Hill Book Company. Another fabrication technique of LiNbO$_3$ waveguides is reported on in the article "Laser Micro-Fabrication of Waveguide Devices", B. Fan et al., IBM Technical Disclosure Bulletin, Vol. 31, No. 11, April 1989, pp. 150–152.

The external fiber 69.1 is fixed in groove 72 by moving it towards the waveguide 73 and fixing it in the optimum position with an optical cement. These fiber to waveguide couplers are known in the art and their coupling efficiency is quite good. Two papers reporting on this coupling principle are; "Passive Coupling of InGaAsP/InP Laser Array and Singlemode Fibers Using Silicon Waferboard", C. A. Armiento et al., Electronics Letters, Vol. 27, No. 12, June 1991, pp. 1109–1111, and "Self-Aligned Flat-Pack Fiber-Photodiode Coupling", B. Hillerich, A. Geyer, Electronics Letters, Vol. 24, No. 15, pp. 918–919.

A magnified perspective sketch of waveguide directional coupler 68.4 is illustrated in FIG. 7 b). The principle of these waveguide directional couplers 68.1–68.4, which are integrated on chip 64, is described in the book "Optical Integrated Circuits", of H. Nishihara et al., McGraw-Hill Optical And Electrooptical Engineering Series, McGraw-Hill Book Company, Chapter 9. The separation g between the upper waveguide, with reference number 76.1, and waveguide 75 should be about 2 $\mu$m. A lightwave emitted by laser diode 62.4 travels through waveguide branch 76.1, passes the 'knee' 77, and leaves the waveguide directional coupler 68.4 at branch 76.2. A lightwave arriving at the opposite side, at branch 76.2, and having the power $P_2$, is to a great amount coupled into the second waveguide 75, where it is fed to fiber 69.4. The power $P_2$ of this lightwave, being coupled into waveguide 75, is smaller than $P_1$. The remaining portion of the lightwave, not being coupled into waveguide 75, has the power $P_3=P_1-P_2$. To prevent optical feedback to the laser diodes 62.1–62.4, which may cause damage of these diodes, optical isolators 67.1–67.4 are inserted between the waveguide directional couplers 68.1–68.4 and these diodes.

The optical isolators, as for example described in chapter 10 of the book "Optical Integrated Circuits", of H. Nishihara et al., McGraw-Hill Optical And Electrooptical Engineering Series, McGraw-Hill Book Company, are comparable to an ideal diode. This optical isolator is able to guide a lightwave, which is inserted on the left hand side (present embodiment), to the waveguide directional coupler and the following optical 4×4 switch 61 with very low losses. Light arriving from a waveguide coupler at this optical isolator is stopped, such that no light arrives at the laser diodes. This second embodiment shows some details of how to implement the present invention. More exemplary details are given in FIGS. 8-12.

Figure 8:
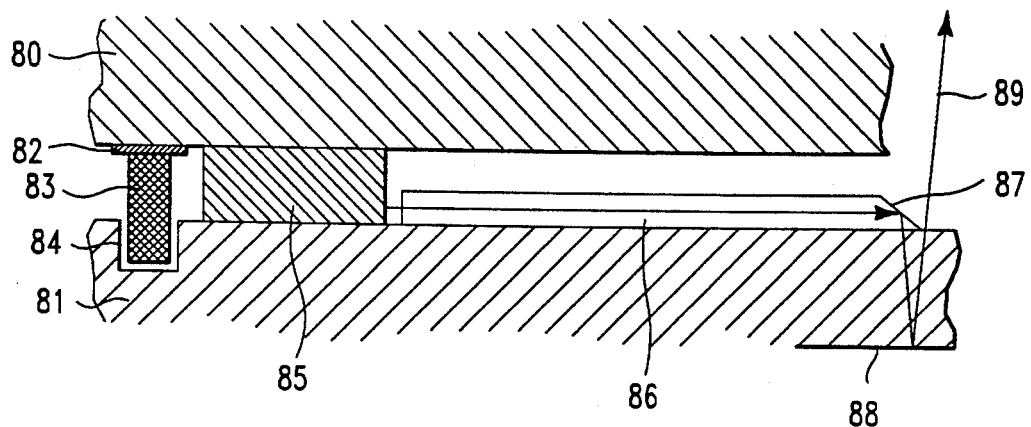
FIG. 8 is a cross-section through a composite in accordance with the present invention.

FIG. 8 shows a cross-section through a composite in accordance with the present invention. The upper chip 80, in the following referred to as 'active' chip, comprises a laser diode 85 with etched mirrors and a metal pillar 83 being electro-plated on top of a plating base 82. The method for making laser diodes with etched mirrors, as integrated on the 'active' chip 80, is disclosed in the European Patent Application with publication number 0 363 547, "Method for Etching Mirror Facets of III-V Semiconductor Structures".

The opposite chip 81, hereinafter referred to as 'passive' chip, comprises a schematically shown waveguide 86 and a depression 84. When flipping the 'active' and 'passive' chips together, the metal pillar 83 fits into the depression 84 such that the light emitting facet of laser diode 85 is aligned to waveguide 86. This waveguide 86 has an inclined facet 87 at its end which reflects the laser beam 89 into the substrate of the 'passive' chip 81. Laser beam 89 is reflected at the backside 88 of this chip and leaves the chip pointing upwards. The following articles report on waveguides with inclined facet:

"Fabrication and Application of Beveled Structures in Optical Waveguides", M. M. Oprysko et al., IBM Technical Disclosure Bulletin, Vol. 32, No. 11, April 1990, pp. 305-307;

"Beveled Waveguides for Flip Chip Opto-Electronic Receivers", E. B. Flint et al., IBM Technical Disclosure Bulletin, Vol. 33, No. 7, December 1990, pp. 194-196;

"Three-Dimensional Optical Waveguide Splitter", M. M. Oprysko et al., IBM Technical Disclosure Bulletin, Vol. 34, No. 5, October 1991, pp. 46-48.

As can be seen from these exemplary articles, different solutions are known in the art for the implementation of means which reflect a beam out of a waveguide. The materials of both chips 80 and 81 and the components integrated on these chips can be chosen as shown in Tables 1-4.

Figure 9:
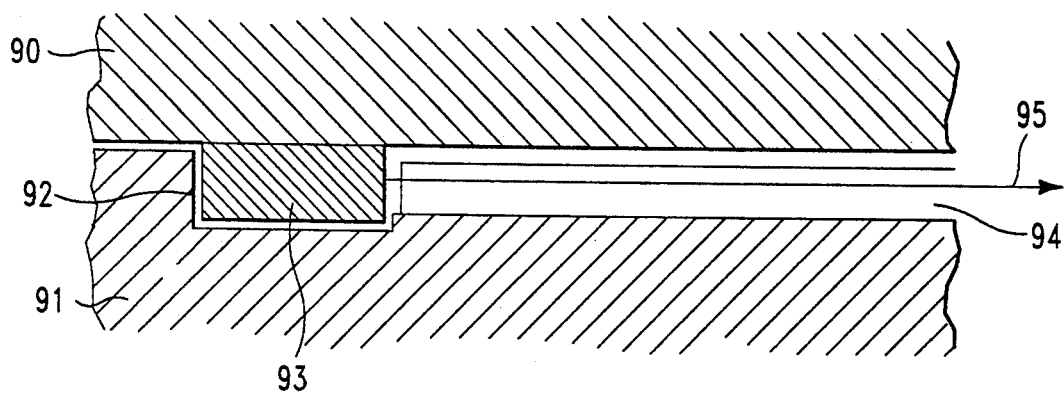
FIG. 9 is a cross-section through a composite in accordance with the present invention.

Another implementation of the present invention is illustrated in FIG. 9. Similar to the composite shown in FIG. 8, the 'active' chip 90 comprises a laser diode 93 with etched mirrors. The 'passive' chip 91 comprises a depression 92, which has the size of said laser diode 93, and a schematically shown waveguide 94 which is aligned to the depression 91. When flipping both chips together, as shown in FIG. 9, the laser 93 fits into depression 92 and is automatically aligned to waveguide 94. Laser beam 95, emitted by laser 93, is guided through this waveguide and coupled out of the composite. In this example, the laser diode 93 on one side and the depression 92 on the other side serve as alignment means.

Figure 10:
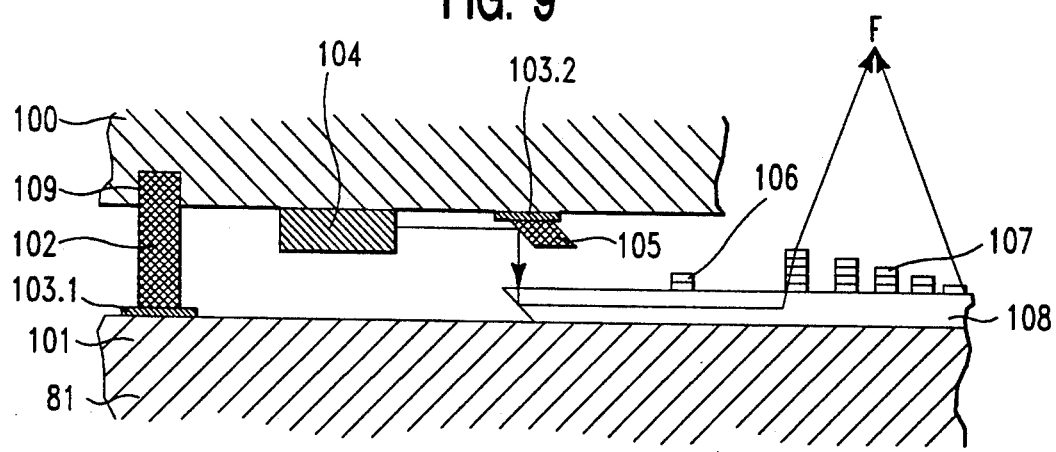
FIG. 10 is a cross-section through a composite in accordance with the present invention.

Another illustrative composite, its cross-section being shown in FIG. 10, requires a greater distance between 'active' and 'passive' chips 100 and 101. Again a laser diode 104 is situated on the 'active' chip 100. Additionally an electro-plated mirror 105.1, oriented at 45°, which is electro-plated on plating base 103.2, and a depression 109 are situated on chip 100. 'Passive' chip 101 comprises a pillar 102 formed on top of a plating base 103.1 and a waveguide 108. This waveguide has an inclined facet 108.1 at one end to receive a vertical beam from mirror 105.1 and direct it horizontally. A waveguide collimating lens 106 and a focusing grating coupler 107 are situated on top of waveguide 108. The waveguide lens 106 is used to collimate the waveguide mode travelling to the right through waveguide 108 and focusing grating coupler 107 focuses the light out of waveguide 108 into focus point F. Details of focusing grating coupler 107, in combination with collimating lens 106, are given in the article "Rotationally Symmetric Construction Optics for a Waveguide Focusing Grating", G. N. Lawrence et al., Vol. 29, No. 15, May 1990, pp. 2315-2319.

Figure 11:
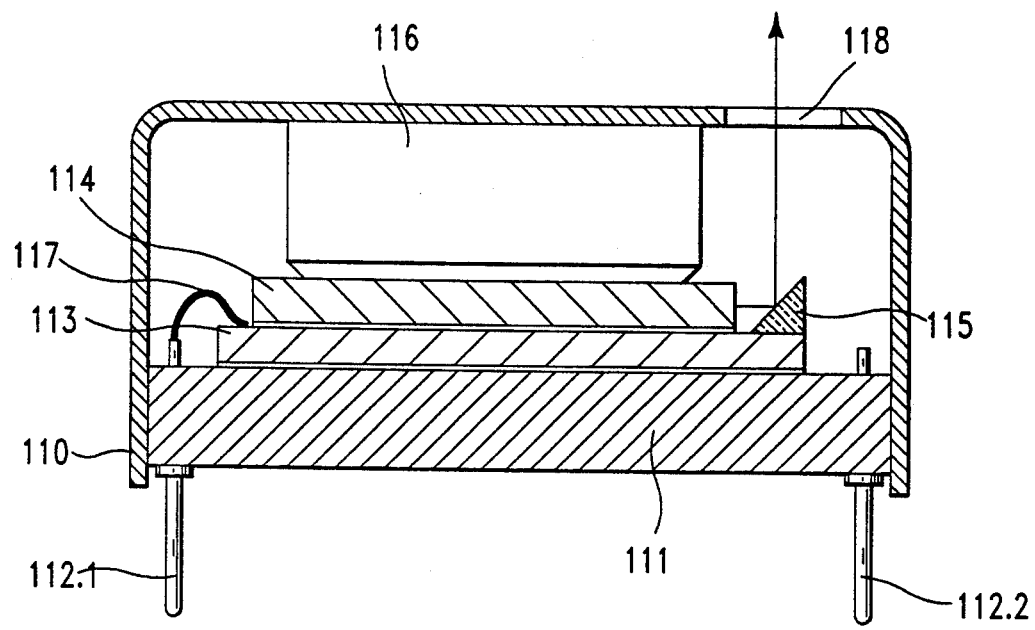
FIG. 11 is a cross-section through an optoelectronic package containing a composite in accordance with the present invention.

FIG. 11 shows a packaging example for an inventive composite. This composite, comprising an upper chip 114, which is the 'passive' one, and a lower, 'active' chip 113, is mounted on a mounting base 111. The whole composite is encapsulated in a metal housing 110 which has a window 118 serving as optical interconnection port. Two metal pins 112.1 and 112.2 are schematically shown, providing for an electrical interconnection between the composite and other circuits. The composite is connected via metal wires, one of them, with reference number 117, being shown in FIG. 11, to said pins. A piston 116 serves as heat transfer bridge between the backside of chip 114 and the housing 110. This heat transfer bridge may be replaced by other bridges as described in the European Patent Application with application number 91810342.5, "Cooling Structures and Package Modules for Semiconductors". Mounting base 111 serves as heat transfer bridge between the 'active' chip and the housing 110. A mirror 115, in particular an electro-plated mirror, is situated on the lower chip 113 such that a light beam emitted by the upper chip 114 is reflected through window 118 out of the housing. Different other packaging modules for composites in accordance with the present invention will be readily apparent to those skilled in the art. The 'passive' chip, for example, may be directly mounted on the mounting base and the upper, 'active' chip may be cooled via a capstan, piston, or a spring.

Figure 12:
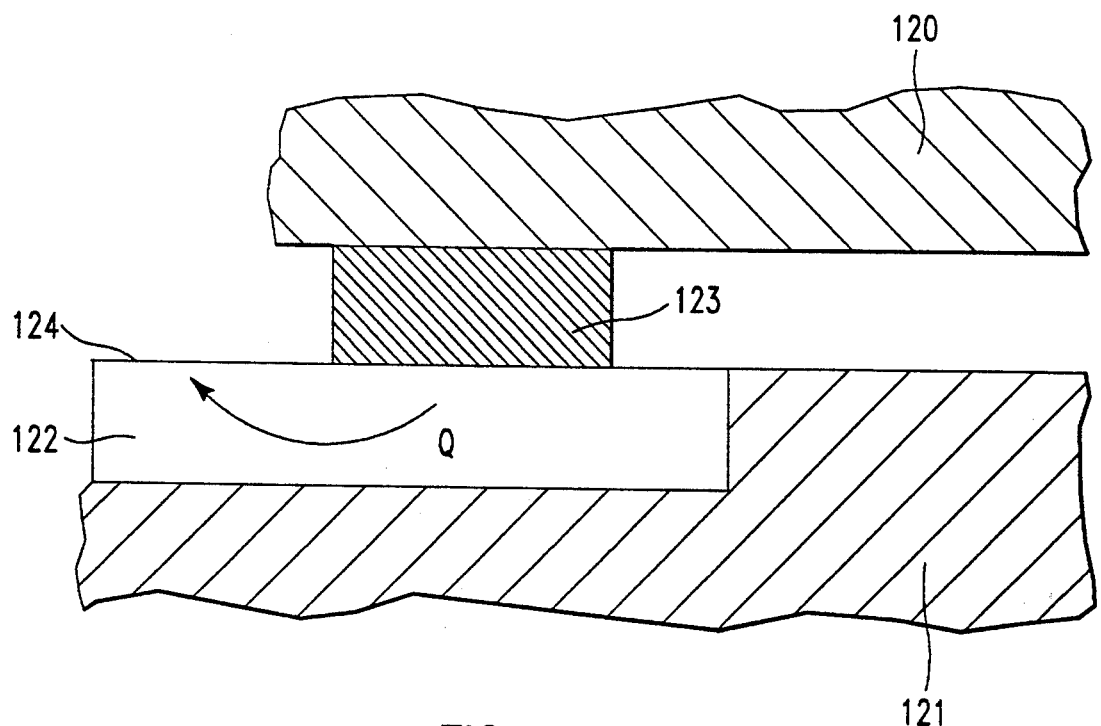
FIG. 12 is a detailed cross-section through a composite in accordance with the present invention.

FIG. 12 illustrates a detail sketch of an inventive composite. This composite comprises a lower chip 121 with an electro-plated metal plate 122, and another chip 120 with an active component 123. The upper chip 120 is flipped onto the lower one such that the active component 123 is thermally connected, either directly or via a thermal grease, to the metal plate 122. This plate serves as a heat sink or a heat transfer bridge. In addition this metal plate can be used as electric contact to the active component. Similar to the embodiments disclosed in the above cited European Patent Application 91810342.5, a metal structure, called cooling structure, may be electro-plated on top of the active devices of an 'active' chip, forming a very efficient heat transfer bridge or a heat sink for smaller heat sources. Very efficient cooling of the composite is required to prevent damage caused by thermally induced stress or strain and to avoid thermal cross-talk between active devices. As mentioned, a Peltier element can be employed to control the temperature of the inventive composites.

What is claimed is:

1. A bilithic optoelectronic composite comprising a first optoelectronic integrated circuit formed on a first substrate and a second optoelectronic integrated circuit formed on a second substrate formed from a compound comprising at least two elements and permitting the formation of at least one of an electro-optic device, an acousto-optic device, a magneto-optic device, a nonlinear optical device, or a thermo-optic device therein, said first optoelectronic integrated circuit comprising at least one active optical device and said second optoelectronic integrated circuit comprising at least one functional optical waveguide device, at least one of said optical devices on said first substrate cooperating with at least one of said optical devices on said second substrate to form a combined optoelectronic system, in which said composite includes alignment means having a male portion on one of said first and second substrates and a female portion on the other of said first and second substrates such that alignment of said first and second optoelectronic integrated circuits by said alignment means aligns those of said optical devices in one of said first and second optoelectronic integrated circuits that cooperate with counterpart devices on the other of said first and second optoelectronic integrated circuits.

2. A composite according to claim 1, in which a groove in each of said first and second substrates serves as a dual female portion aligning with an optical fiber extending partially into both of said grooves in each of said first and second substrates.

3. A composite according to claim 1, in which at least one of said male portions of said alignment means is an optical device, whereby said optical device performs an optical function in said bilithic optoelectronic composite and also serves a mechanical alignment function.

4. A composite according to claim 3, in which said at least one of said male portions of said alignment means is an active optical device.

5. A composite according to claim 4, in which said at least one of said male portions of said alignment means is a laser diode and a counterpart female portion is a waveguide coupled to said laser diode when said first and second optoelectronic integrated circuits are in alignment.

6. A composite according to claim 3, in which said at least one of said male portions of said alignment means is a passive optical device.

7. A composite according to claim 6, in which said at least one of said male portions of said alignment means is a ridge waveguide.

8. A bilithic optoelectronic composite comprising a first optoelectronic integrated circuit formed on a first substrate and a second optoelectronic integrated circuit formed on a second substrate, each of said first and second optoelectronic integrated circuits comprising at least one optical device, at least one of said optical devices on said first substrate cooperating with at least one of said optical devices on said second substrate to form a combined optoelectronic system, in which said composite includes alignment means having a male portion on one of said first and second substrates and a female portion on the other of said first and second substrates such that alignment of said first and second optoelectronic integrated circuits by said alignment means aligns those of said optical devices in one of said first and second optoelectronic integrated circuits that cooperate with counterpart devices on the other of said first and second optoelectronic integrated circuits, characterized in that:

at least one of said male portions of said alignment means is an optical device, whereby said optical device performs an optical function in said bilithic optoelectronic composite and also serves a mechanical alignment function.

9. A composite according to claim 8, in which said least one of said male portions of said alignment means is an active optical device.

10. A composite according to claim 9, in which said least one of said male portions of said alignment means is a laser diode and a counterpart female portion is a waveguide coupled to said laser diode when said first and second optoelectronic integrated circuits are in alignment.

11. A composite according to claim 8, in which said least one of said male portions of said alignment means is a passive optical device.

12. A composite according to claim 11, in which said least one of said male portions of said alignment means is a ridge waveguide.

13. A composite according to any of claims 1, 2 or 8–12, in which at least one non-optical electronic device is formed in one of said first and second substrates.

14. A composite according to any of claims 1, 2 or 8–12, in which said first substrate is selected from the group comprising gallium arsenide and indium phosphide and said second substrate is formed from lithium niobate.

* * * * *